US009905532B2

(12) United States Patent
Joshi et al.

(10) Patent No.: US 9,905,532 B2
(45) Date of Patent: Feb. 27, 2018

(54) METHODS AND APPARATUSES FOR HIGH TEMPERATURE BONDING AND BONDED SUBSTRATES HAVING VARIABLE POROSITY DISTRIBUTION FORMED THEREFROM

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 15/064,981

(22) Filed: Mar. 9, 2016

(65) Prior Publication Data
US 2017/0263586 A1    Sep. 14, 2017

(51) Int. Cl.
*H01L 23/00* (2006.01)
*H01L 23/373* (2006.01)

(52) U.S. Cl.
CPC .......... *H01L 24/83* (2013.01); *H01L 23/3735* (2013.01); *H01L 23/3736* (2013.01);
(Continued)

(58) Field of Classification Search
CPC ......... H01L 24/83; H01L 24/27; H01L 24/75; H01L 23/3737; H01L 2224/291;
(Continued)

(56) References Cited

U.S. PATENT DOCUMENTS 5,882,455 A * 3/1999 Bezama ................. B32B 37/18
156/323
6,468,923 B1 * 10/2002 Yonehara ............... C25D 11/32
257/E21.102
(Continued)

FOREIGN PATENT DOCUMENTS

JP     10-031220 A   *  2/1998  ........... G02F 1/1341
JP     2008-311371 A *  12/2008  ............. H01L 21/52
JP     2012-129330    *  7/2012  ............. H01L 21/52

OTHER PUBLICATIONS

Translation of JP2010-129330 A, Sakamoto et al. (Jul. 5, 2012) 10 pages.*
(Continued)

*Primary Examiner* — Caridad Everhart
(74) *Attorney, Agent, or Firm* — Dinsmore & Shohl LLP

(57) ABSTRACT

Methods and systems of bonding substrates include disposing a low melting point material and one or more high melting point materials having a higher melting temperature than a melting temperature of the low melting point material between a first substrate and a second substrate to form a substrate assembly including a contacting surface comprising first and second areas; applying a first force at the first area; and applying heat to form a bond layer between the first and second substrates. A first formed porosity of the bond layer is aligned with the first area of the contacting surface. A second formed porosity of the bond layer is aligned with the second area of the contacting surface to which the first force was not applied, and the first formed porosity is different from the second formed porosity.

19 Claims, 7 Drawing Sheets

(52) U.S. Cl.
CPC .............. *H01L 24/27* (2013.01); *H01L 24/75* (2013.01); *H01L 2224/29082* (2013.01); *H01L 2224/29111* (2013.01); *H01L 2224/29124* (2013.01); *H01L 2224/29144* (2013.01); *H01L 2224/29147* (2013.01); *H01L 2224/29155* (2013.01); *H01L 2224/32245* (2013.01); *H01L 2224/32501* (2013.01); *H01L 2224/753* (2013.01); *H01L 2224/7525* (2013.01); *H01L 2224/8312* (2013.01); *H01L 2224/8382* (2013.01); *H01L 2224/8384* (2013.01); *H01L 2224/83203* (2013.01); *H01L 2924/014* (2013.01); *H01L 2924/01013* (2013.01); *H01L 2924/01029* (2013.01); *H01L 2924/10253* (2013.01); *H01L 2924/10272* (2013.01)

(58) Field of Classification Search
CPC ... H01L 2224/2919; H01L 2224/83203; H01L 2924/01029; H01L 2924/2924; H01L 2224/838; H01L 23/373; H01L 2224/83201; H01L 2224/32501; H01L 2224/8323; H01L 2924/10272; H01L 2924/01013; H01L 2924/10253
See application file for complete search history.

(56) References Cited

U.S. PATENT DOCUMENTS

| | | | |
|---|---|---|---|
| 6,989,134 B2 | 1/2006 | Tonkovich et al. | |
| 7,692,926 B2 | 4/2010 | Henderson et al. | |
| 8,882,868 B2 | 11/2014 | Walia et al. | |
| 2008/0160183 A1* | 7/2008 | Ide | H01B 1/02 427/126.5 |
| 2012/0055586 A1* | 3/2012 | McIsaac | B23K 1/0008 148/24 |
| 2012/0267149 A1* | 10/2012 | Oi | H01L 21/4807 174/255 |
| 2015/0137412 A1 | 5/2015 | Schalansky | |
| 2015/0171054 A1* | 6/2015 | Yamayose | H01L 24/32 257/773 |
| 2015/0255419 A1 | 9/2015 | Nishimoto et al. | |

OTHER PUBLICATIONS

Machine Translation of Miyahara et al. (JP 2008-311371A) (Dec. 25, 2008) 32 pages.*
Machine Translation of Tanaya (JP 10-0331220A) (Feb. 3, 1998) 7 pages.*

* cited by examiner

METHODS AND APPARATUSES FOR HIGH TEMPERATURE BONDING AND BONDED SUBSTRATES HAVING VARIABLE POROSITY DISTRIBUTION FORMED THEREFROM

TECHNICAL FIELD

The present specification generally relates to methods and apparatuses for high temperature bonding systems and substrates formed therefrom and, more specifically, to methods and apparatuses for high temperature bonding systems to form and control a variable porosity distribution in a bond layer between substrates to improve thermal and mechanical properties in the bond layer.

BACKGROUND

Power semiconductor devices, such as those fabricated from SiC (silicon carbide), may be designed to operate at very high operating temperatures (e.g., greater than 250° C.). Such power semiconductor devices may be bonded to a cooling device, such as a heat sink or a liquid cooling assembly, for example. The cooling device removes heat from the power semiconductor device to ensure that it operates at a temperature that is below its maximum operating temperature. The bond layer that bonds the power semiconductor device to the cooling device must be able to withstand the high operating temperatures of the power semiconductor device.

Transient liquid phase (TLP) sintering (TLPS), diffusion bonding, or soldering are methods of high temperature bonding that may be used to bond one substrate to another (e.g., to bond a power semiconductor to a cooling device). For example, TLP bonding results in a bond layer having a high temperature melting point. A typical TLP bond consists of two different material compounds: a metallic layer and an intermetallic layer or alloy. Generally, the intermetallic layer having a high-remelting temperature is formed during an initial melting phase wherein a low melting temperature material, such as tin, diffuses into high melting temperature materials, such as copper, silver, or nickel.

Conventional methods for heating TLP sintered interconnect microstructures have utilized applying force over an entire bonding assembly to form a strengthened bond layer. Such an overall applied force, however, may cause the formation of less voids near edges of the bond layer, resulting in a more dense edge area that may be more susceptible to cracking due to, for example, a coefficient of thermal expansion mismatch between the bond layer and the substrates.

Accordingly, a need exists for alternative methods for heating TLP sintered interconnect microstructures to form a more strengthened bond layer while improving edge compliance to prevent cracking between a pair of substrates.

SUMMARY

In one embodiment, a method of bonding substrates includes disposing a low melting point material and one or more high melting point materials between a first substrate and a second substrate to form a substrate assembly, and the substrate assembly includes a contacting surface comprising at least a first area and a second area; applying a first force at the first area of the contacting surface of the substrate assembly; and applying heat to the substrate assembly to form a bond layer between the first and second substrates. The one or more high melting point materials have a melting temperature that is higher than a melting temperature of the low melting point material. A first formed porosity of the bond layer is aligned with the first area of the contacting surface. A second formed porosity of the bond layer is aligned with the second area of the contacting surface to which the first force was not applied, and the first formed porosity is different from the second formed porosity.

In another embodiment, a system for bonding of substrates includes a force application device, a substrate assembly in contact with the force application device and including a first substrate and a second substrate, and a heat application device that applies heat to the substrate assembly to form a bond layer between the first and second substrates. The substrate assembly further includes a low melting point material and one or more high melting point materials. The low melting point material and the one or more high melting point materials are disposed between the first and second substrates. The one or more high melting point materials have a melting temperature that is higher than a melting temperature of the low melting point material. The force application device applies a first force at a first area of at least one of a contacting surface of at least the first substrate. A first formed porosity of the bond layer is aligned with the first area. A second formed porosity of the bond layer is aligned with a second area of at least the second substrate to which the first force was not applied, and the first formed porosity is different from the second formed porosity.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
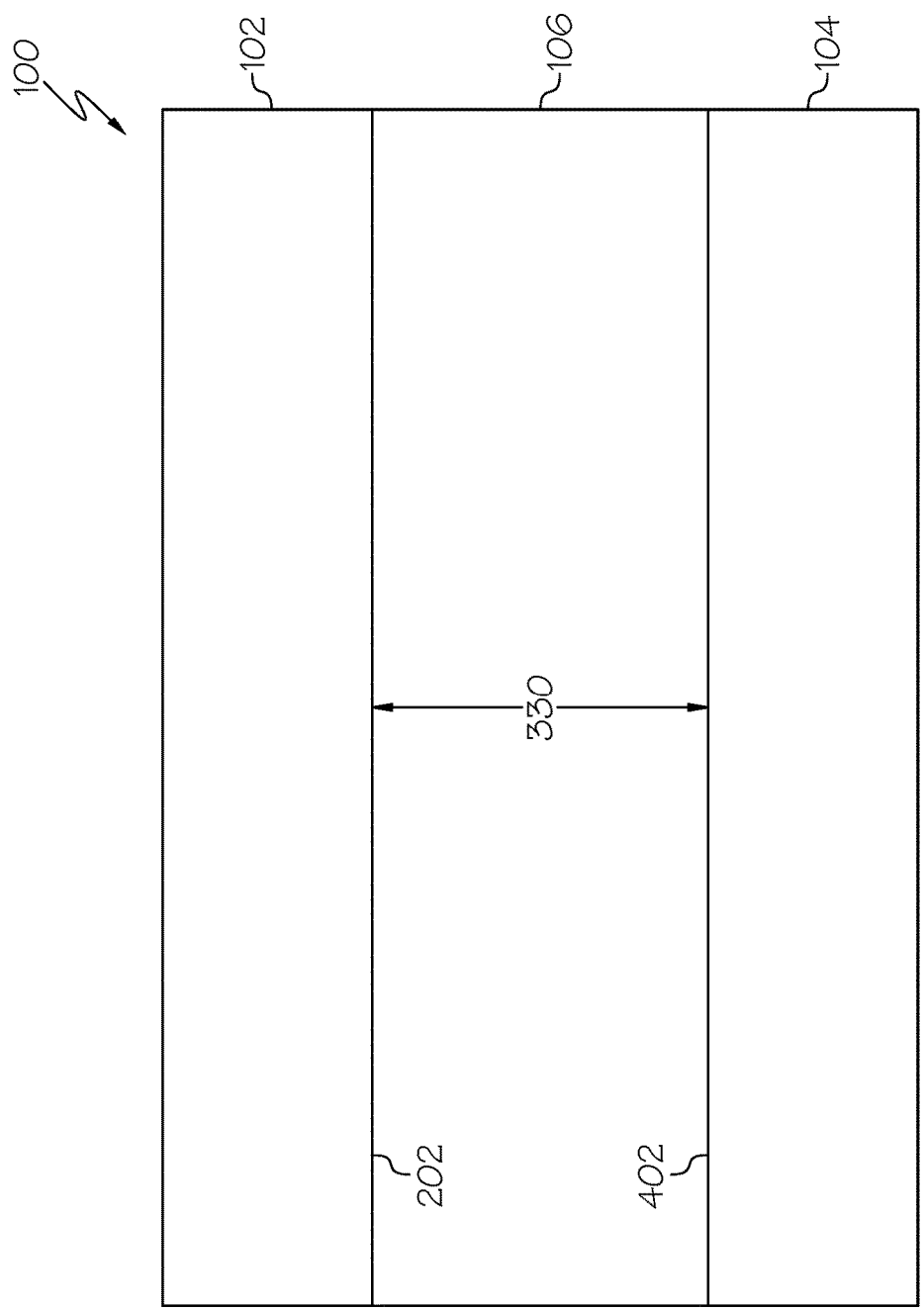
FIG. 1 schematically depicts a side elevation view of two substrates to be bonded to one another with a bond layer, according to one or more embodiments shown and described herein.

Referring generally to the figures, embodiments of the present disclosure are directed to methods and apparatuses for high temperature bonding of a substrate assembly that includes a low melting point material and one or more high melting point materials having a higher melting point than the low melting point material, the materials disposed between the substrates. An application of at least a first force to a first area and not a second area, along with the high temperature bonding forms a bonded substrate assembly having a variable porosity distribution in a bond layer formed between the substrates. The variable porosity distribution results due to application of at least two different forces to at least two different regions of the substrate assembly and reflects a varying distribution of an amount of voids that form through and vary across different portions of the bond layer. The voids, for example, are trapped gasses that form as a result of the high temperature bonding, which may be, for example, a transient liquid phase sintering (TLPS) process (or other high temperature bonding processes), as described in greater detail below. Thus, the bond layer that includes, for example, joints or interconnects between two substrates forms variable porosity distribution as a result of the application of different forces during the TLPS process. The embodiments described herein further form microstructures of TLPS joints with such variable porosity distribution in a manner that enhances the thermal and mechanical performance of electronic systems and maximizes system reliability.

The formed bond layer, for example, may form paste-based TLPS interconnects that are characterized by highly complex microstructures that include intermetallic compounds ("IMCs") as matrix material and have metal particles embedded in that matrix. Inclusion of voids as described above within the interconnects may affect the thermal, electrical and mechanical properties of these interconnects. For example, inclusion of such voids lead to more porous areas of a bond layer, which affects the properties of the bond layer as such formed pockets of trapped gas (e.g., voids) act as insulators rather than conductors and thus act as barriers to conductivity paths, which reduces a thermal conductivity of the bond layer at more porous areas (e.g., at more void-filled areas) of the bond layer.

With a variable porosity distribution, fewer voids (that define pores within porous areas of the bond layer) are formed in certain portions of a bond layer to which a first force is applied than in other portions of the bond layer to which a reduced or zero force is applied. For example, by applying the first force at an aligned first area of the substrate assembly, air (or other formed gases) within the first area is pushed outward by the first force toward areas surrounding the aligned first area. This causes a less porous, more dense first area to which the first force is applied and within the bond layer to be formed, and more porous, less dense areas of the substrate assembly to which the first force is not applied to be formed.

A first force application device may be configured as any device capable of applying the requisite force. Example force application devices include, but are not limited to, at least one of one or more weights, a hydraulic pressure device, and a pneumatic pressure device. The pneumatic pressure may apply a first force F that is less than or equal to 1 MPa. The one or more weights may have a weight in a range of from about 500 g to about 1 kg. Utilization of a weight of about 1 kg, for example, may result in a structure that has a density in the range of about 80% to about 90% with respect to an aligned area of the bond layer 112, while utilization of a weight of about 500 g may result in a structure that has a density of about 50% with respect to an aligned area of the bond layer 112. Further, one or more apparatuses used in the radiant heating process as described herein, such as the upper punch 508 of the spark plasma sintering processing apparatus 500, may be modified to include one or more pressure points aligned with such one or more weights as integrated or attachable components. Alternatively, the one or more weights may be freestanding and placed as described herein at the contacting surface of the first substrate 102.

As described above, the amount of force applied to an area of the substrate assembly is directly proportional to a percentage of density that results in the area. For example, the greater a force to be applied to the aligned first area, the more air that is pushed out from the first area to form fewer voids, and the more dense (and thus less porous) the first area will be in the formed bond layer. As the more dense area includes fewer voids (and thus is less porous), the voids that otherwise acts as insulators result in fewer barriers to conductivity in the more dense area such that thermal conductivity in the more dense area increases. The more dense areas may have a high elastic modulus, however, resulting in an increased rigidity that may cause the more dense areas to be prone to cracking due to, for example, a coefficient of thermal expansion mismatch between the bond layer and the substrate of the bonded substrate assembly.

Less dense areas may be formed at desired locations to increase compliance and prevent against cracking due to stress, such as thermally induced stress caused by high operation temperatures of a semiconductor. For example, the less dense areas include more voids than more dense areas, as the air from more dense areas is pushed out to the less dense areas by the force application device. While the less dense areas may have a decreased thermal conductivity by the presence of an increased amount of voids acting as insulators, those areas may also have a lower elastic modulus resulting in less stiff or less rigid areas that are more compliant to bending and stresses and less prone to cracking. This allows for a coefficient of thermal expansion mismatch to occur between the bond layer and the substrates with a reduced chance of cracking and thus an increased period of use of the bond layer over time.

As described above, an apparatus, such as a force application device, is used to apply a first force to the substrate assembly. Use of the force application device may result in a bonded substrate assembly that includes a bond layer having a more dense structure below the force application device and aligned with the first area, and a less dense structure aligned with a second area where the first force was not applied. The more dense structure may be formed around a center of the substrate assembly, and the less dense structure may be formed around the edges of the substrate assembly to allow for an increased compliance of the bonded substrate assembly that assists to prevent cracking.

Overall, a microstructure and properties (i.e., mechanical, electrical, and thermal) of TLPS joints depend on the TLPS process. During ramping of the temperature in an applied temperature profile during the TLPS process, for example, flux binders are activated to reduce oxides on joint surfaces and the paste metal particles to improve wettability and spreading of low temperature alloys to facilitate the sintering process. Eventually, the flux binders may and should completely leave the interconnect zone, such as by outflowing or outgassing to minimize interconnect voiding (i.e., voids otherwise created by remaining or trapped gasses in the interconnect region) and to increase joint quality and reliability. For example, a vacuum environment, such as applicable through a spark plasma sintering process, as described in greater detail further below, would permit outgassing that may improve the wettability and adhesion of the bond layer between the substrates to result in a strengthened bond layer formed by the TLPS interconnects. The chemical and rheological properties of the flux binders depend on the thermal history of the sintering process, and the rheological properties of the low and high temperature metal constituents of the sinter paste and/or powder as described further below as well as the rate and structure of the joint process completion depend on the temperature profile applied during the TLPS process.

TLPS may be used to attached substrates, such as, without limitation, silicon or wideband gap semiconductor devices, to metallic or ceramic substrates for power electronic applications requiring operation at high temperatures. For example, through TLPS, and as described in greater detail further below, pastes and/or powders including micro-sized particles of a low melting point metal (such as tin (Sn)) and a high melting point metal (such as silver (Ag), copper (Cu), aluminum (Al), and/or nickel (Ni)) that are embedded in an organic binder are disposed and sintered between such substrates to form connecting joints or interconnects therebetween. The embodiments described herein include providing a pair of such substrates and positioning a material such as a paste holding tin and a plurality of metal particles therebetween to form a substrate assembly (to which a first force is applied to a first force area and not to a second area outside of the first force area). The tin has a low melting temperature, and the plurality of metal particles have a high melting temperature that is greater than the low melting temperature of tin. The paste may include an organic binder that includes the metal particles.

Referring to FIG. 1, for example, a pre-bond material 106 may include a low melting point material such as tin and one or more high melting point materials such as silver, copper, aluminum, and/or nickel as described herein. Thus, a low melting point material and one or more high melting point materials are disposed in the pre-bond material 106 between a first substrate 102 and a second substrate 104 to form the pre-bonding substrate assembly 100.

In embodiments, two or more substrates may be bonded to one another with a thermally conductive bond layer formed by TLP bonding. The TLP bond layers disclosed herein may have relatively high melting points and may be thermally stable through exposure to heat that is of a higher temperature than that used to form the bonds. These bonds may be useful in applications where substrates experience thermal cycling at relatively high temperatures (e.g., greater than about 200° C.). For example, bonding techniques may not be suitable described herein may be suitable for systems exposed to the thermal cycling of a power semiconductor device.

Various embodiments of methods and apparatuses for high temperature bonding of substrates and substrates formed therefrom are described in detail herein. Although example methods for high temperature bonding of substrates are described in the context of power electronics applications (e.g., to bond a power semiconductor device to a cooling assembly in an inverter circuit of hybrid or electric vehicles), the use of methods described herein is not limited thereto. Example methods and substrates formed therefrom that are described herein may be implemented in other semiconductor use applications and other applications to bond at least two components together.

Generally, in embodiments of TLP bonded substrates, each of the substrates may comprise a substrate bonding surface which contacts a bond layer that is positioned between and contacting the substrates. The bond layer may be formed from a bond layer precursor that may comprise particles of one or more metals. The particles may undergo TLP bonding to form intermetallic alloy materials comprising the materials of the bond layer precursor and the one or more substrates.

In embodiments, the TLP bond layers may be formed by conventional heating means, such as radiant, conductive, and/or Joule heating. For example, radiant heat may be applied via use of a furnace, conductive heating may be applied via use of soldering, and Joule heating may be applied via use of spark plasma sintering, as described in greater detail further below. The formed bond layer may include various properties such as, without limitation, Young's modulus (i.e., elastic modulus), shear modulus, Poisson's ratio, elongation, ultimate stress, yielding stress, density, melting point, electric resistivity, coefficient of thermal expansion, creep, and thermal conductivity.

The formed bond layer is sandwiched between the two substrates in a layer that is relatively thin. The bond layer may be formed by a TLP sintering process such as, without limitation, a spark plasma sintering process. Generally, a spark plasma sintering process induces sintering by running a current through the bonding material precursor to heat the bonding material precursor. Spark plasma sintering, as described further below in greater detail with respect to FIG. 5, may also include an application of pressure on the bonding material precursor.

Referring again to FIG. 1, a system of an example pre-bonding substrate assembly 100 includes a first substrate 102 (e.g., upper substrate) and a second substrate 104 (e.g., lower substrate) between which a pre-bond material 106 is positioned. The pre-bond material 106 is positioned generally between the first substrate 102 and the second substrate 104 and directly contacts the first substrate 102 at the first substrate bonding surface 202 and the second substrate 104 at the complementary second substrate bonding surface 402. The pre-bond material 106 may comprise alloys of metals, pure metals, or any combination thereof, and may be disposed each in different portions of the pre-bond material 106. As used herein, an "alloy" refers to a material composition that comprises at least two metallic or metalloid components, and a "pure metal" refers to a material that comprises at least about 99.5% of an elemental metal. As used herein "metals" refer to materials comprising metal elements, metalloid elements, or combinations thereof, in an amount of at least about 50%.

In one embodiment, the first substrate bonding surface 202 and/or the second substrate bonding surface 402 may be substantially planar and substantially parallel relative to one another. While one substrate is referred to herein as the "upper substrate" or the "first substrate" and the other substrate is referred to herein as the "lower substrate" or the "second substrate," the two substrates 102, 104 need not necessarily be arranged above and below one another, and the nomenclature of "upper" and "lower," and, respectively, "first" and "second," is merely representative of the relative positioning in the first substrate 102 and second substrate 104 as depicted in the drawings described herein. Additionally, it should be understood herein that any feature of the first substrate 102 may be included in the second substrate 104, and vice versa. Generally, the first substrate 102 and the second substrate 104 each comprise bonding surfaces, referred to as the first substrate bonding surface 202 and the second substrate bonding surface 402, respectively. The first substrate bonding surface 202 and second substrate bonding surface 402 may be referred to as "complementary" herein, meaning that the two bonding surfaces generally have geometries making them suitable for bonding with one another, such as with a bond layer 112 as described in embodiments herein.

It is contemplated herein that the composition of the first substrate 102 at the first substrate bonding surface 202 may be any of the material compositions disclosed herein as a composition of the first substrate 102. Additionally, it is contemplated herein that the composition of the second substrate 104 at the second substrate bonding surface 402 may be any of the material compositions disclosed herein as a composition of the second substrate 104. In some embodiments, the material composition of the upper substrate 102 and the second substrate 104 may vary between the portions of each. For example, the material composition at the first substrate bonding surface 202 may be different from the composition of other portions of the first substrate 102, and the material composition at the second substrate bonding surface 402 may be different from the composition of other portions of the second substrate 104. For example, the first substrate 102 or the second substrate 104 may comprise a coating layer at the first substrate bonding surface 202 or second substrate bonding surface 402, respectively.

The first substrate 102 and/or second substrate 104 may comprise a wide variety of materials, including, but not limited to, one or more metals or alloys such as, but not limited to, materials comprising copper, aluminum, nickel, or combinations thereof. In embodiments, the first substrate 102 and/or second substrate 104 may comprise at least about 50% copper, aluminum, and/or nickel, at least about 60% copper, aluminum, and/or nickel, at least about 70% copper, aluminum, and/or nickel, at least about 80% copper, aluminum, and/or nickel, at least about 90% copper, aluminum, and/or nickel, at least about 95% copper, aluminum, and/or nickel, at least about 99% copper, aluminum, and/or nickel, and/or at least about 99.5% copper, aluminum. For example, the first substrate 102 and/or second substrate 104 may comprise a heat sink for a power electronic device.

In other embodiments, the first substrate 102 and/or second substrate 104 may comprise metal oxides, metal nitrides, metal carbides, or combinations thereof, including, but not limited to, alumina, beryllium oxide, aluminum nitride, silicon carbide, or combinations thereof. For example, the first substrate 102 and/or second substrate 104 may be a die for a power electronic device. In embodiments, the first substrate 102 and/or second substrate 104 may comprise at least about 50% metal oxides, metal nitrides, and/or metal carbides, at least about 60% metal oxides, metal nitrides, and/or metal carbides, at least about 70% metal oxides, metal nitrides, and/or metal carbides, at least about 80% metal oxides, metal nitrides, and/or metal carbides, at least about 90% metal oxides, metal nitrides, and/or metal carbides, at least about 95% metal oxides, metal nitrides, and/or metal carbides, at least about 99% metal oxides, metal nitrides, and/or metal carbides, and/or at least about 99.5% metal oxides, metal nitrides, and/or metal carbides. It is contemplated herein that the composition of the first substrate 102 at the first substrate bonding surface 202 and/or the composition of the second substrate 104 at the second substrate bonding surface 402 may be any of the material compositions disclosed herein.

In one embodiment, the first substrate 102 and/or second substrate 104 may comprise a direct bonded metal, such as, but not limited to, direct bonded copper (DBC) or direct bonded aluminum (DBA) at the respective first substrate bonding surface 202 or second substrate bonding surface 402. For example, direct bonded metallic layer may be bonded to the pre-bond material 106 by a high-temperature oxidation process where copper and the bulk material are heated to a controlled temperature in an atmosphere of nitrogen containing about 30 ppm of oxygen to form a copper-oxygen eutectic. In another embodiment, the first substrate 102 and/or second substrate 104 may comprise a material that is metal plated on the respective first substrate bonding surface 202 or second substrate bonding surface 402, such as a nickel plated first substrate bonding surface 202 or nickel plated second substrate bonding surface 402.

The pre-bond material 106 may comprise a TLP bonded material. In embodiments, the TLP bonded material may undergo TLP bonding by a heating process, such as radiant heating under pressure. Generally, TLP bonding is characterized by a bond between two or more materials that may be stable to heating conditions above those in which the bond is formed. To form a TLP bond, a low melting point material and a high melting point material are utilized to form an intermetallic alloy comprising the materials of the high melting point material and the low melting point material. The high melting point material and the low melting point material may be referred to as precursor materials, and following the TLP bonding process (e.g., by radiant heating or other means), the precursor materials are at least partially converted to an intermetallic alloy. As used herein, a low melting point material refers to a material in a TLP bonding process which has a lower melting point than the high melting point material. The TLP bonding process may utilize a heating temperature that is between the melting points of the low melting point material and the high melting point material.

Figure 2:
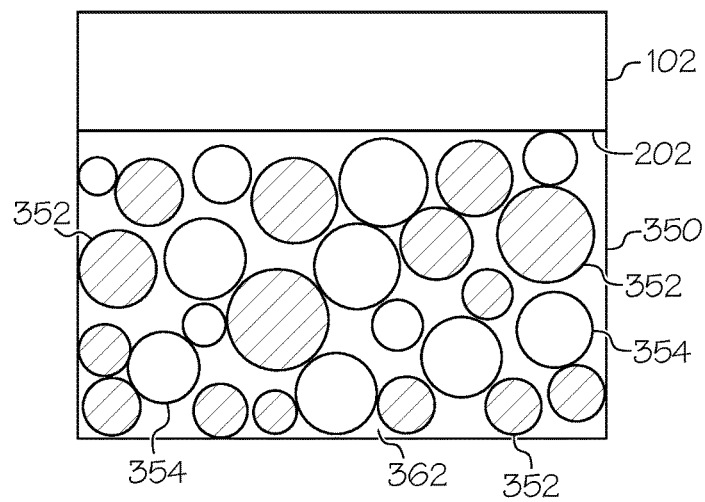
FIG. 2 schematically depicts an enlarged cross-sectional side view of a portion of a bond layer precursor adjacent an upper substrate prior to radiant, conductive, and/or Joule heating, according to one or more embodiments shown and described herein.

The formation of the TLP bond from the pre-bond material 106 will be described in additional detail with reference to FIGS. 2-4. The pre-bond material 106 comprises a bond layer precursor 350 comprising a plurality of particles of higher and lower melting point materials that may be contained in an organic binder, as described below. FIG. 2 schematically depicts an enlarged cross-section side view of the bond layer precursor 350 adjacent a substrate prior to heating, where the enlarged view depicts only the interface of the first substrate 102 with the pre-bond material 106 comprising the bond layer precursor 350. While FIG. 2 does not show the second substrate 104, it is to be understood that the bond layer precursor 350 may similarly interact with the second substrate 104 as described herein with respect to the interaction of the bond layer precursor 350 with the first substrate 102.

The bond layer precursor 350 may comprise a plurality of particles, which are contained in an organic binder 362. The particles may have an average particle size of, without limitation, from about 1 micron to about 200 microns, such as from about 2 microns to about 50 microns. The bond layer precursor 350 may comprise two or more material compositions. For example, FIG. 2 depicts particles having two different material compositions. Particles 352 shown in FIG. 3 may represent a low melting point material, and particles 354 may represent a high melting point material. In some embodiments, the high melting point material may be identical to that of the first substrate 102. The bond layer precursor 350 may be packed by the applied pressure supplied by, for example, a spark plasma sintering apparatus as described in greater detail below with respect to FIG. 5.

In one embodiment, the low melting point particles 352 may comprise a wide variety of materials, including, but not limited to, one or more metals or alloys such as, but not limited to, materials comprising tin, such as at least about 50% tin, at least about 60%, at least about 70% tin, at least about 80% tin, at least about 90% tin, at least about 95% tin, at least about 99% tin, or even at least about 99.5% tin. In embodiments, the low melting point material may have a melting point of less than about 600° C., less than about 550° C., less than about 500° C., less than about 450° C., less than about 400° C., less than about 350° C., less than about 300° C., or even less than about 250° C. As a non-limiting example, tin has a melting point of about 232° C.

The high melting point particles 354 may comprise a wide variety of materials, including, but not limited to, one or more metals or alloys such as, but not limited to, materials comprising silver, copper, aluminum, nickel, or combinations thereof. In embodiments, the upper substrate 102 may comprise at least about 50% silver, copper, aluminum, and/or nickel, at least about 60% silver, copper, aluminum, and/or nickel, at least about 70% silver, copper, aluminum, and/or nickel, at least about 80% silver, copper, aluminum, and/or nickel, at least about 90% silver, copper, aluminum, and/or nickel, at least about 95% silver, copper, aluminum, and/or nickel, at least about 99% silver, copper, aluminum, and/or nickel, and/or at least about 99.5% silver, copper, aluminum, and/or nickel.

In other embodiments, the high melting point particles 354 may comprise metal oxides, metal nitrides, metal carbides, or combinations thereof, including, but not limited to, alumina, beryllium oxide, aluminum nitride, silicon carbide, or combinations thereof. In embodiments, the high melting point particles 354 may comprise at least about 50% metal oxides, metal nitrides, and/or metal carbides, at least about 60% metal oxides, metal nitrides, and/or metal carbides, at least about 70% metal oxides, metal nitrides, and/or metal carbides, at least about 80% metal oxides, metal nitrides, and/or metal carbides, at least about 90% metal oxides, metal nitrides, and/or metal carbides, at least about 95% metal oxides, metal nitrides, and/or metal carbides, at least about 99% metal oxides, metal nitrides, and/or metal carbides, and/or at least about 99.5% metal oxides, metal nitrides, and/or metal carbides.

In embodiments, the high melting point particles 354 may have melting points of at least about 300° C., at least about 400° C., at least about 500° C., at least about 600° C., at least about 800° C., or at least about 1000° C. For example, in embodiments the material of the high melting point particles 354 may have a melting point of at least about 50° C. greater, at least about 100° C. greater, at least about 200° C. greater, or at least about 400° C. greater than the material of the low melting point particles 352.

Within the bond layer precursor 350 (i.e., within the pre-bond material 106), the low melting point material may be of a weight percent of 70% tin of the pre-bond material 106 and the one or more high melting point materials may be of a weight percent of at least one of 30% silver, copper, aluminum, and/or nickel of the pre-bond material 106. For example, the one or more high melting point materials may be of a weight percent of 30% nickel. In other embodiments, the high melting point materials (e.g., silver, copper, aluminum, nickel, other suitable like metal materials, or any combination thereof) includes a weight percent of in the range of about 20% to about 40%, and the tin as the low melting point material comprises a respective weight percent in the range of about 80% to about 60%. As another non-limiting example, the amount of tin may include a weight percent of 60% tin, and the amount of the plurality of high melting point materials may include a weight percent of 40% nickel and/or copper. Or the amount of tin may include a weight percent of 80% tin, and the amount of the plurality of high melting point materials may include a weight percent of 20% silver.

Figure 3:
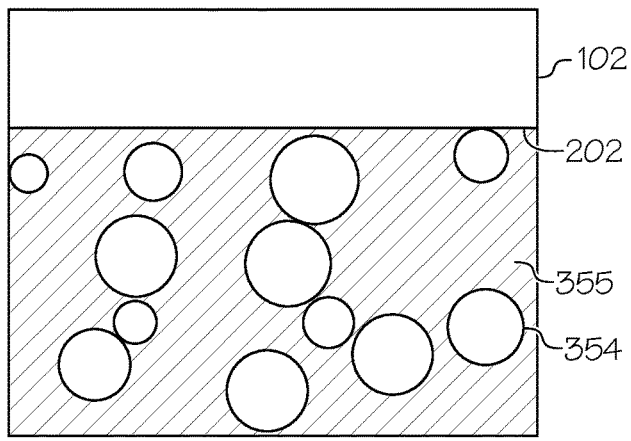
FIG. 3 schematically depicts an enlarged cross-sectional side view of a portion of a bond layer positioned adjacent a substrate during radiant, conductive, and/or Joule heating, according to one or more embodiments shown and described herein.

As described above, the system is heated to melt the low melting point particles 352, and FIG. 3 depicts the bond layer while the TLP bonding is taking place. As the bond layer precursor 350 is heated, the low melting point particles 352 melt to form a low melting point material matrix 355. The heating also burns off the organic binder 362. At this stage, the low melting point particles 352 have melted to surround and directly contact the high melting point particles 354. Additionally, at this temperature, some of the material of the low melting point particles 352, now melted as the low melting point material matrix 355, diffuses into the high melting point particles 354. The diffusion of the material of the low melting point material matrix 355 into the high melting point particles creates an intermetallic alloy, for example, comprising the materials of the low melting point particles 352 and the high melting point particles 354.

However, the alloy formed by diffusion has a higher melting point, and due to the liquidus and solidus concentrations at a given temperature above the melting point of the low melting point material, solid intermetallic is formed even at temperatures above that of the melting point of the low melting point material. The same phenomena of diffusion may also occur at the interface of the first substrate 102, where an intermetallic alloy is formed from diffusion of the low melting point material into the first substrate 102. The material of low melting point continues to diffuse into the material of high melting point to form intermetallic alloys that at least partially solidify at the heating temperature.

Figure 4:
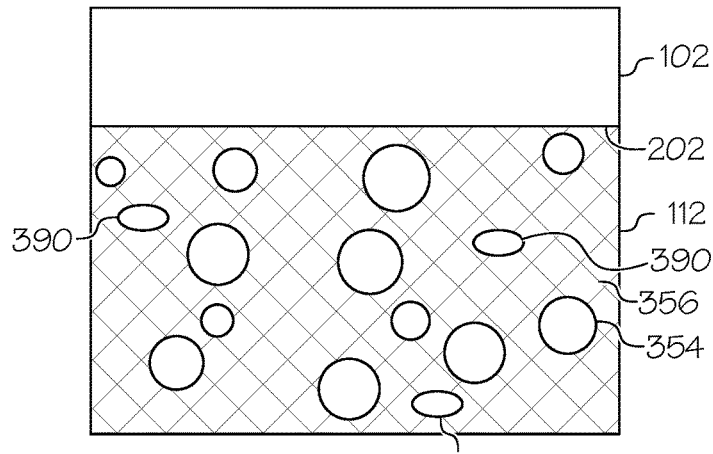
FIG. 4 schematically depicts an enlarged cross-sectional side view of a portion of a bond layer following radiant, conductive, and/or Joule heating, according to one or more embodiments shown and described herein.

FIG. 4 depicts a bond layer that has been formed by TLP bonding. The bond layer 112 comprises some particles 354 of high melting point material in an intermetallic alloy 356 comprising the materials of the high melting point particles 354 and the low melting point particles 352. High melting point particles 354 are reduced in size because some of its material is present in the intermetallic alloy 356. The bond layer 112 further comprises some voids 390 formed by the TLP bonding. Following the heating, the system is cooled to fully solidify the bond layer 112.

For example, in a system with a tin material for the low melting point particles 352 and copper for the high melting point particles 354 and the first substrate 102, the tin may have a melting point of about 232° C. and the copper may have a melting point of about 1085° C. In such an embodiment, a bonding temperature of greater than about 250° C. but less than about 1000° C. may be utilized. The TLP bonding may form an alloy comprising tin and copper as the intermetallic alloy 356.

Referring to FIGS. 1 and 4, after bonding, the substrates 102, 104 may be spaced by an example thickness 330 (e.g., a thickness of the bond layer 112 of FIG. 4), which is the distance between the first substrate bonding surface 202 and the second substrate bonding surface 402. In embodiments, the thickness 330 of the bond layer 112 may be, without limitation, from about 5 microns to about 5000 microns, or from about 100 microns to about 500 microns. For example, the thickness 330 of the bond layer 300 may be, without limitation, at least about 5 microns, at least about 100 microns, less than or equal to about 5000 microns, less than or equal to about 500 microns, or combinations thereof.

Figure 5:
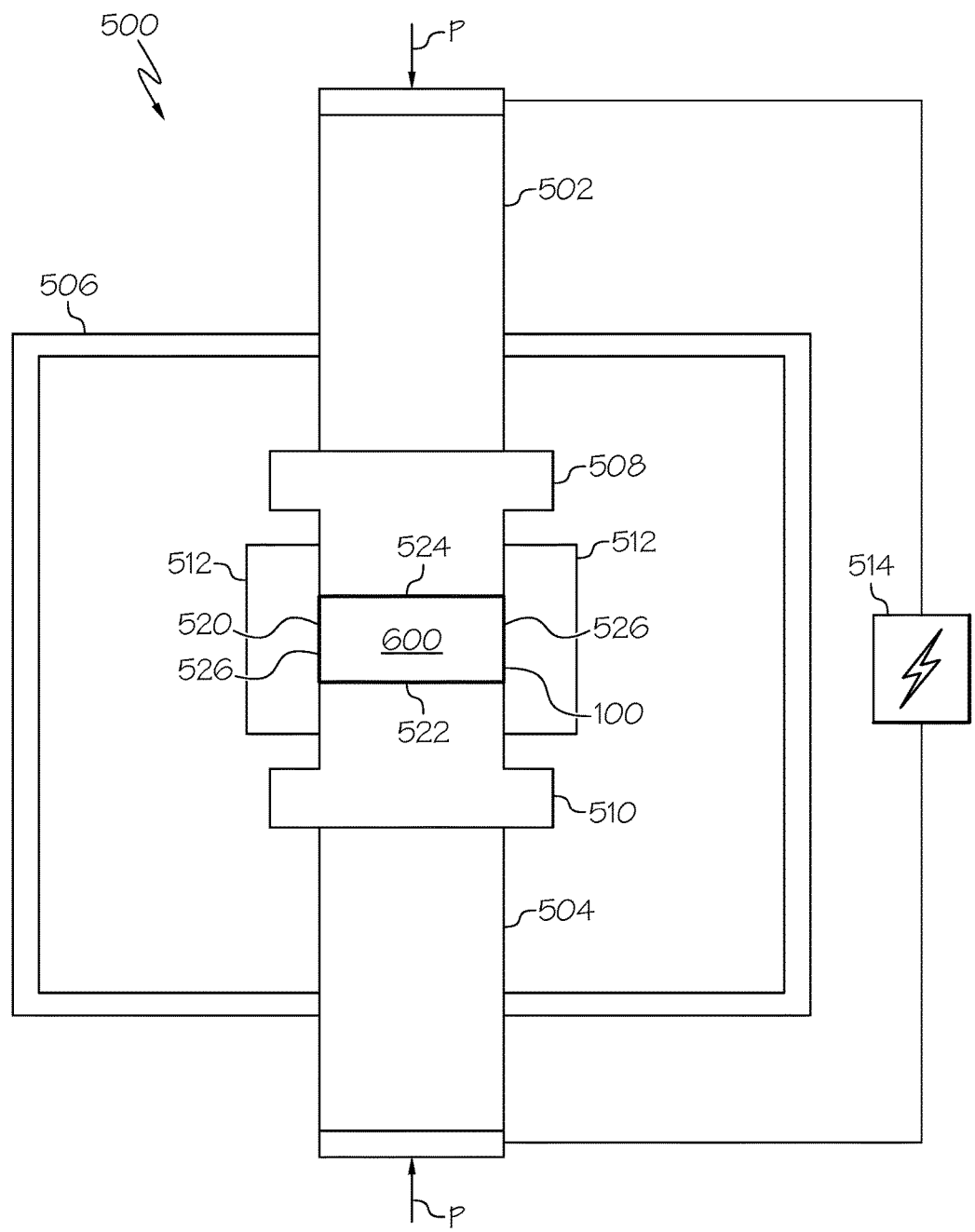
FIG. 5 schematically depicts an example spark plasma sintering processing apparatus, according to one or more embodiments shown and described herein.

FIG. 5 schematically depicts an example of a spark plasma sintering processing apparatus 500 that may be used to apply Joule heating, for example, in which heat is applied via electric current and pressure, as described in greater detail below. The spark plasma sintering processing apparatus 500 may comprise an upper electrode 502, a lower electrode 504, a vacuum chamber 506, a DC pulse generator 514, and a chamber die 512. The upper electrode 502 may comprise an upper punch 508, and the lower electrode 504 may comprise a lower punch 510. The chamber die 512 and the upper and lower punches 508, 510 may define a sintering chamber 520, where the lower punch 510 defines a floor 522 of the sintering chamber 520, the chamber die defines the sides 526 of the sintering chamber 520, and the upper punch 508 defines the ceiling 524 of the sintering chamber 520.

Generally, the substrate assembly to be sintered is placed in the sintering chamber 520 during processing. FIG. 5 depicts a substrate assembly 600 in the sintering chamber 520, where the second substrate 104 is adjacent the lower punch 510, the first substrate 102 is adjacent the upper punch 508, and the bond layer 112 is positioned between the second substrate 104 and the first substrate 102. During spark plasma sintering processing, an overall pressure (labeled with arrows marked "P" in FIG. 2) is applied by the lower electrode 504 and the upper electrode 502 such that the materials housed in the sintering chamber 520 come under lateral pressure by the upper and lower punches 508, 510. Additionally, during the spark plasma sintering processing, a DC pulse is applied to the material housed in the sintering chamber 520 by the DC pulse generator 514. The DC pulse generator 514 sends an electrical pulse through the upper electrode 502, through the chamber die 512, and into the lower electrode 504. The resistance of the materials housed in the sintering chamber 520 heats the sintering chamber 520 when electrical pulsing is applied by the DC pulse generator 514. The sintering temperatures may be controlled by variations is several parameters of the DC pulse including, but not limited to, electrical pulse holding time, pulsing ramp rate, pulse duration, and pulse current and voltage. Without being bound by theory, the DC pulse discharge may generate spark plasma, spark impact pressure, Joule heating, and/or an electrical field diffusion effect.

In embodiments, the spark plasma sintering processing may comprise a chamber evacuation step, application of pressure, application of an electrical current, and cooling. In the chamber evacuation step, the vacuum chamber 506 may be evacuated of air to form a vacuum condition. As used herein, a vacuum condition does not refer to a theoretic vacuum (P=0), but rather a low pressure common in laboratory vacuum conditions such as less than about 5%, less than about 1%, or even less than about 0.1% of atmospheric pressure. In the application of pressure step, the upper punch 508 and lower punch 510 apply pressure upon the contents of the sintering chamber 520. A single overall applied pressure may be in a range from about 1 MPa to about 50 MPa, such as, for example, from about 5 MPa to about 40 MPa, or from about 20 MPa to about 30 MPa. The voltage and current of the electrical pulsing may vary, and may depend upon the materials to be sintered. Heating may be to a temperature between the melting points of the high melting point material and the low melting point material in order to form the transient liquid phase substrate assembly.

Figure 6A:
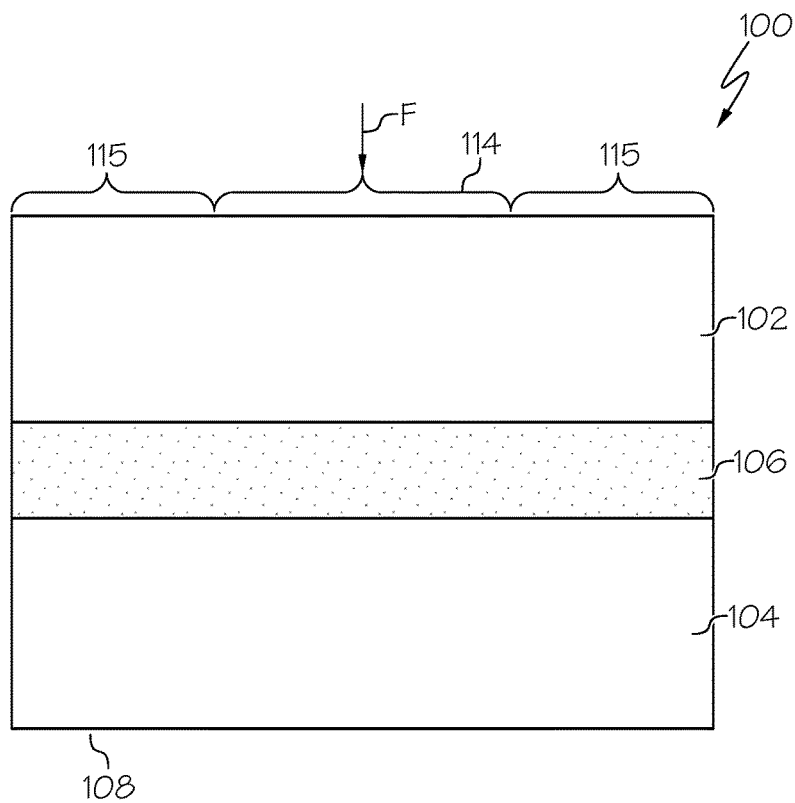
FIG. 6A schematically depicts a first bonding assembly having a first (applied force) area and a second and prior to forming a bond layer between a pair of substrates via radiant heating, according to one or more embodiments shown and described herein.

FIG. 6A illustrates an example pre-bonding substrate assembly 100 assembled and prepared for a high temperature bonding of substrates, such as a TLPS bonding, for example. The substrate assembly 100 comprises a contacting surface including at least a first area 114 and a second area 115. A first force F may be applied at the first area 114 of the contacting surface of the substrate assembly 100. The substrate assembly 100 includes the first substrate 102 and the second substrate 104. The first substrate 102 includes a die that is made of Si (silicon), SiC (silicon carbide), or the like. The second substrate 104 may include direct bonded copper, direct bonded aluminum, or the like. It should be understood that other substrate materials suitable for a high temperature heating application, and as described herein, are within the scope of this disclosure.

As shown in FIG. 6A, a pre-bond material 106 is positioned between the first substrate 102 and the second substrate 104 to form the pre-bonding substrate assembly 100. As a non-limiting example, the pre-bond material 106 may be a paste or powder that forms the bond layer precursor 350 within which sinter joint objects such as metal particles are disposed as described herein.

Figure 6B:
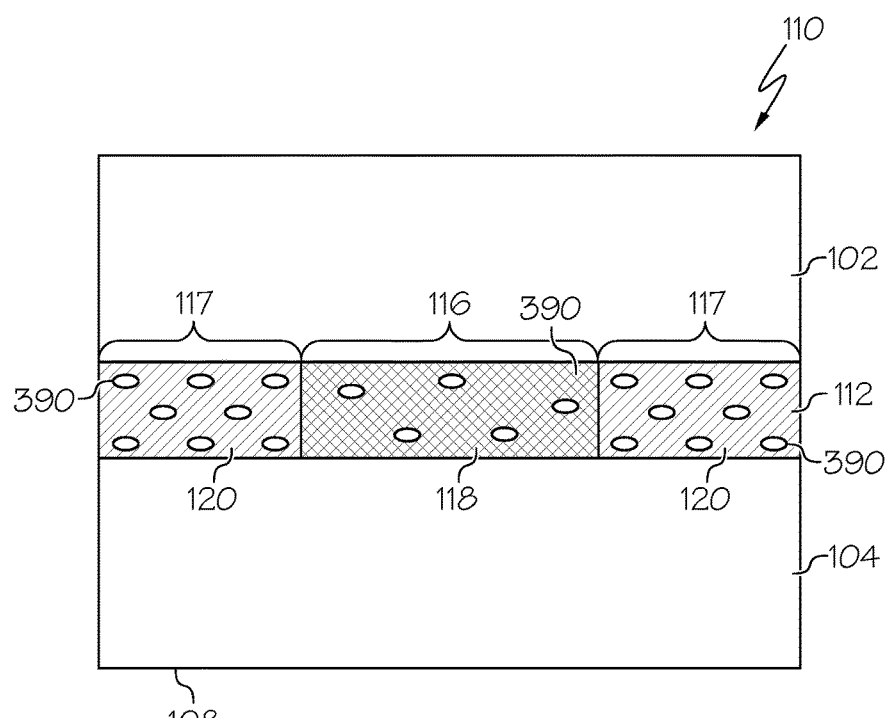
FIG. 6B schematically depicts the first bonding assembly of FIG. 6A after undergoing radiant heating, in which the first bonding assembly has a formed bond layer between the pair of substrates with a variable porosity distribution, according to one or more embodiments shown and described herein.

Referring to FIG. 6B, heat via radiant heating, for example, is applied to the substrate assembly 100 to form a bond layer 112 between the first and second substrates 102, 104 to form a bonded substrate assembly 110. For example, upon a high temperature heating, the pre-bond material 106 including a paste holding an amount of tin and metal particles forms IMCs or intermetallic alloys in the bond layer 112 of a bonded substrate assembly 110 as described above. The heating may be part of a TLPS heating or soldering or a diffusion soldering process as conventionally known and applied in a controlled processing environment as described herein. A first formed porosity 118 of the bond layer 112 is formed as a result of the heating and is aligned with the first area 114 of the contacting surface, which may be a contacting surface of at least one of the first and second substrates 102, 104. For the purposes of description herein, however, the contacting surface is described below as a contacting surface of the first substrate 102, while it is to be understood that the contacting surface may be a contacting surface of the second substrate 104 and/or a combination of the surfaces of first and second substrates 102, 104.

A second formed porosity 120 of the bond layer 112 is aligned with the second area 115 of the contacting surface to which the first force F was not applied. The first formed porosity 118 is different from the second formed porosity 120. For example, the first formed porosity 118 may be more dense and have fewer voids 390 (and thus be less porous) than the second formed porosity 120.

Figure 7A:
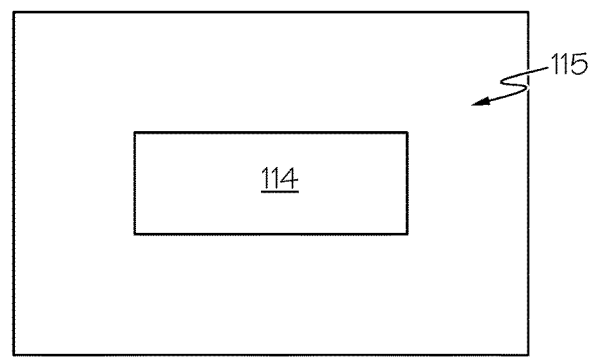
FIG. 7A schematically depicts a top plan view of an example of the first bonding assembly of FIG. 6A, according to one or more embodiments shown and described herein.

FIG. 7A illustrates a top view of the embodiment of FIG. 6A, and FIGS. 7B-10 show respective top plan views of alternative embodiments of the substrate assembly 100 of FIG. 6A. A configuration or pattern of an applied weight affects porosity formed in the bond layer 112 of FIG. 6B, and FIGS. 7A-10 indicate various configurations that may be applied as non-limiting examples.

Figure 7B:
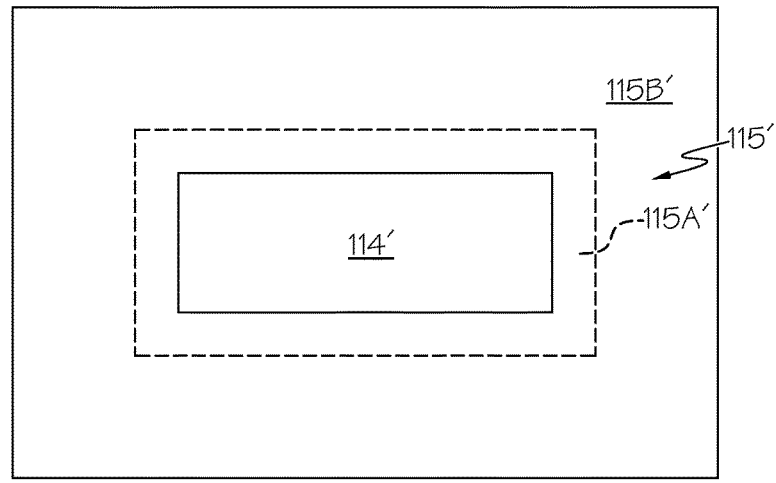
FIG. 7B schematically depicts a top plan view of another example of the first bonding assembly of FIG. 6A, according to one or more embodiments shown and described herein.

FIG. 7A illustrates first area 114 and second area 115 as the top view of FIG. 6A. Alternatively, FIG. 7B illustrates an embodiment of FIG. 6A that may include a first area 114', and a second area 115' including a first portion 115A' and a second portion 115B'. FIGS. 7A-7B illustrates such areas and portions in square or rectangular shapes, though other shapes are within the scope of this disclosure.

In embodiments, as shown in FIG. 7A, the first area 114 of the contacting surface is aligned with a central area 116 of the substrate assembly 110, and the second area 115 of the contacting surface is aligned with an outer edge area 117 of the substrate assembly 110. No force may be applied to the second area 115 of the contacting surface resulting in, for example, a second formed porosity 120 that is much less dense and includes more pores than the first formed porosity 118. In alternative embodiments, a second force is applied at the second area 115 of the contacting surface of the substrate assembly 100. The second force may be less than the first force F and greater than zero such that the second formed porosity 120 is less dense and more porous than the first formed porosity 118.

For example, the embodiment of FIG. 7A has the first force F applied to the first area 115 and not applied to the second area 115, which results in a different porosity and density structure being formed in the first area 114 than the second area 115. If the first force F is applied to the first area 114, and either a reduced force or no force is applied to the second area 115, air (or other potential trapped gasses) is pushed out from the first area 114 by the application of the first force F and into the surrounding second area 115. The first area 114 will then have fewer voids formed and be a more dense structure than the second area 115. As a non-limiting example, the first area 114 may have a first force F of about 1 kg applied such that a resulting structure has a density in the range of about 80% to about 90%, and the reduced second force may be a force of about 500 g that is applied to the second area 115 such that the second area 115 has a resulting structure having a density of about 50%.

FIGS. 7B-10 illustrate non-limiting examples where the second force may include at least two separate first and second reduced forces that are each less than the first force F. Referring to FIG. 7B, as an example and not a limitation, the first reduced force comprises a force greater than zero that is applied to a first portion 115A' of the second area 115' aligned with the first reduced force. The second reduced force may comprise a zero force such that no force is applied to a second portion 115B' of the second area 115' aligned with the second reduced force. As an alternative example and not a limitation, the second reduced force comprises a force greater than zero and less than the first reduced force that is applied to a second portion 115B' of the second area 115' aligned with the second reduced force. The first area 114' of the contacting surface may be aligned with a central area 116 of the substrate assembly 110. The first portion 115A' of the second area 115' of the contacting surface is aligned with an inner portion of an outer edge area 117 of the substrate assembly 110, and the second portion 115B' of the second area 115' of the contacting surface is aligned with an outer portion of the outer edge area 117 of the substrate assembly 110.

Thus, the embodiment of FIG. 7B shows a second area 115' including a first portion 115A' and a second portion 115B', which may each have different respective and different forces applied that are both less than the first force F applied to the first area 114'. The reduced forces may be directly proportional to reduced density structures of respective areas of the bond layer, and less dense areas associated with reduced applied forces result in more porous regions having a reduced thermal conductivity and an increased compliance as described herein. In the examples of FIGS. 7A-7B, while the forces are applied in square or rectangular patterns, other force application configurations are within the scope of this disclosure.

Figure 8:
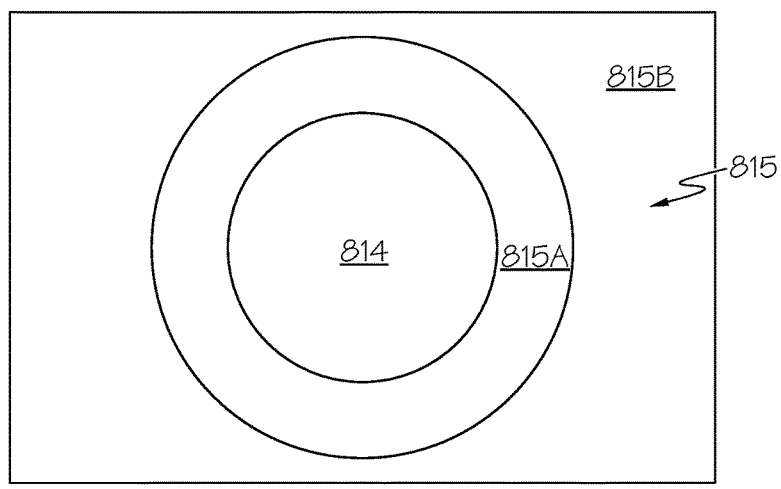
FIG. 8 schematically depicts a top plan view of another example of the first bonding assembly of FIG. 6A, according to one or more embodiments shown and described herein.
Figure 9:
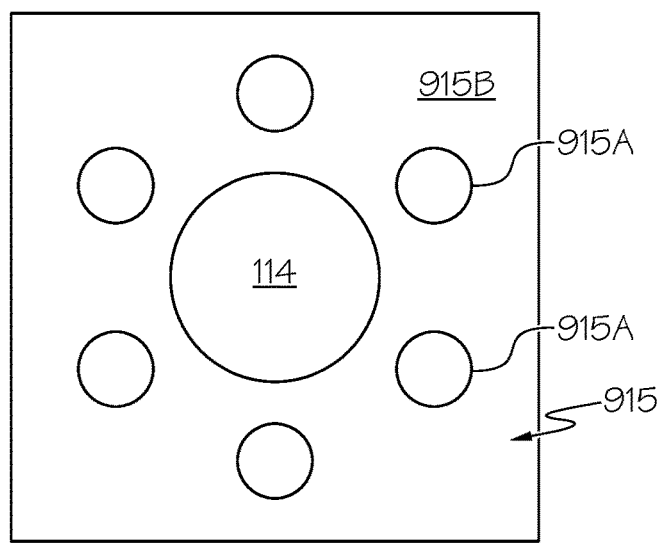
FIG. 9 schematically depicts a top plan view of yet another example of the first bonding assembly of FIG. 6A, according to one or more embodiments shown and described herein.

FIGS. 8 and 9 depict other non-limiting examples of force application configurations. FIG. 8 depicts an embodiment wherein a first force F is applied to a circular first area 814. The second area 815 includes a first portion 815A that surrounds the first area 814, and a second portion 815B outside of the first portion 815A. As an example, a second force may be applied to the first portion 815A of the second area 815. The second force may be less than the first force F. No force, or a force that is less than the second force, may be applied at the second portion 815B of the second area 815.

FIG. 9 depicts an embodiment of FIG. 6A in which the first area 914 is defined by a circular central shape, and the second area 915 is defined by a plurality of circular shapes representing a first portion 915A and a surrounding second portion 915B. For example, as described in greater detail further below, multiple circular forces may apply the same force aligned with the first portion 915A while a single first force F is aligned with the first area 914. The first force F may be larger than a second force applied to the first portion 915A. A zero force, or a force less than the force associated with the plurality of circular forces aligned with the first portion 915A, may be applied to the second portion 915B. Alternatively, the first force F may be applied to both the first area 914 and the first portion 915A, and a reduced force, such as a zero force or another force less than the first force F, may be applied the to the second portion 915B. As a non-limiting example, the second force may be applied by a plurality of circular weights at the first portion 915A, each having a weight that is less than the single weight aligned with the first area 914 that applies the first force F. Each circular weight aligned with the first portion 915A may have the same weight or may be substantially similar and vary within reasonable tolerances.

Figure 10:
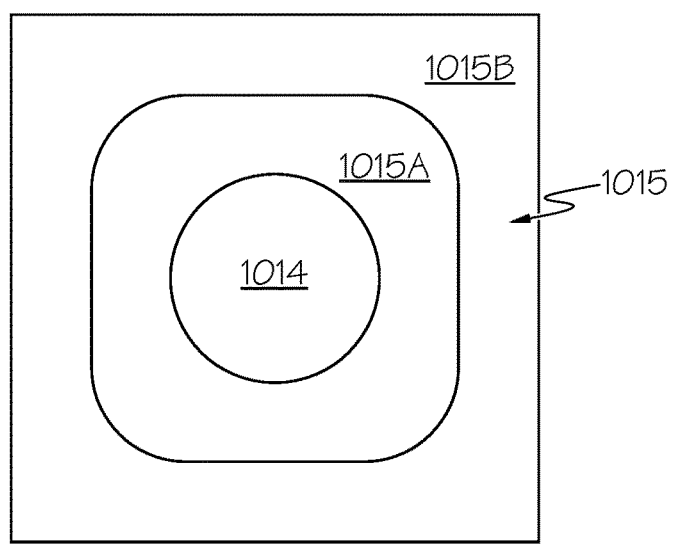
FIG. 10 schematically depicts a top plan view of one other example of the first bonding assembly of FIG. 6A, according to one or more embodiments shown and described herein.

FIG. 10 illustrates an embodiment of FIG. 6A in which the shape of the various array may vary, such as having a circular shape for the first area 1014 and a square or rectangular shape for the first portion 1015A of the second area 1015. As described above, a first force F aligned with the first area 1014 may be greater than a second force aligned with the first portion 1015A of the second area 1015, which second force may be greater than a third force aligned with the second portion 1015B of the second area 1015. The application of the greater first force F may thus result in the first area 1014 being the most dense region of the bond layer 112, followed by the first portion 1015A which has a less dense region than the first area 1014, and then followed by the second portion 1015B that is a less dense region than both the first area 1014 and the first portion 1015A. Other such interchangeable shapes and/or patterns of force application configurations are within the scope of this disclosure. For example, radial shapes and/or linear shapes along with other shapes or patterns are within the scope of this disclosure.

Figure 11:
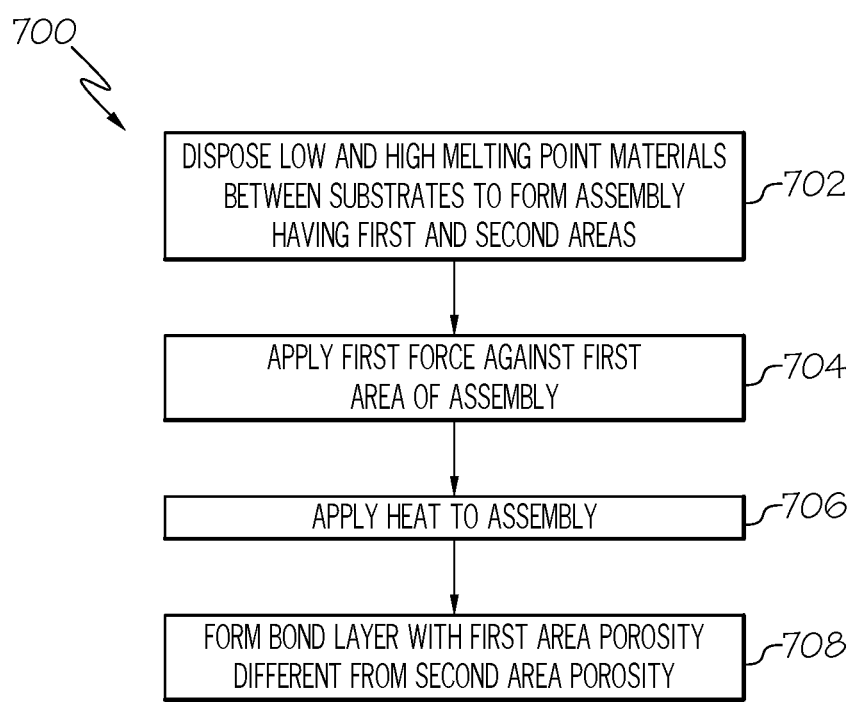
FIG. 11 depicts a flow chart of a method of forming the first bonding assembly of FIG. 6B, according to one or more embodiments shown and described herein.

Referring to FIG. 11, a method 700 to form the substrate assembly 110 of FIG. 6B from the substrate assembly 100 of FIG. 6A includes, as illustrated in block 702, disposing low and high melting point materials between substrates 102, 104 of substrate assembly 100 of FIG. 6A, for example, which substrate assembly 100 includes the first area 114 and the second area 115. In block 704 of FIG. 11, a first force F is applied at the first area 114 of the assembly. Referring to FIGS. 6A and 11, the first force F may be applied at the first area 114 of the contacting surface of the substrate assembly via the first force application device, as described above.

In block 706, the substrate assembly 100 is heated such that, in block 708, a bond layer 112 is formed within a formed substrate assembly 110 as described herein and has a first formed porosity 118 that is different from a second formed porosity 120. Thus, following the method of FIG. 11, a bond layer 112 is formed from a high temperature bonding of substrates 102, 104. The bond layer 112 includes a variable porosity between at least a central area 116 and an outer edge area 117 of the bond layer 112. The central area 116 of the bond layer 112 comprises a more dense structure than the outer edge area 117 of the bond layer 112. Thus, the central area 116 includes fewer voids than, and an improved conductivity over, the outer edge area 117 as fewer voids are present to act as insulators and thus barriers to conductivity. Concurrently, the outer edge area 117 comprises more voids than, and an improved compliance over, the central area 116 to assist to prevent cracking of the bond layer 112 as the more voids assist to form a less rigid and more compliant structure.

Block 708 allows for a formation of the a bond layer 112 that has a variable porosity distribution that may be, for example, varying in an inward to outward manner such that a central area is less porous that an outer edge area, and the porosity increases from the central area in a direction toward the outer edge area. Alternatively, it is contemplated that other patterns of variable porosity distribution may formed. For example, porosity may steadily increase from the central area toward the outer edge area or may increase in more sectionalized and discrete patterns. It is contemplated that porosity may vary across a gradient formed between a placement of separate forces at the contacting surface of the first substrate 102. It is further contemplated that an inner portion of the outer edge area 117 may be more porous than an outer portion of the outer edge area 117 while the central area 116 has a porosity that is greater than or equal to the porosity of the outer portion of the outer edge area 117. Having a less porous region near the edge and not directly at the edge may still result in an increased compliance of the bond layer that may assist to prevent cracking of the bond layer.

Referring again to block 706 of FIG. 11, the radiant heating step may utilize a system including a graphical user interface (GUI) that may show details of the heating process that are accessible at a user workstation such as an a computer, which is associated with at least a server, a database, a wide area network (WAN) such as an intranet or the Internet, or local area network (LAN), and input/output hardware and/or software to send and receive data. Exemplary input/output hardware includes but is not limited to universal serial bus (USB), FireWire, Thunderbolt, LAN port, wireless fidelity (Wi-Fi) card, WiMax card, and/or other hardware for communication with other networks and/or external devices. System components may be communicatively coupled via communication paths as described above (through wires or wirelessly).

The system may further include a controller having at least one processor and at least one non-transitory computer-readable storage medium, such as memory, that is in communication with at least one processor. Any of the at least one non-transitory computer-readable storage mediums may include respective one or more programming instructions executable by a respective at least one processor to cause the at least one processor to enact steps such as those described with respect to FIG. 11, such as, for example, the force application step of block 704, heating step of block 706, and/or monitoring of the bond formation step of block 708.

It should now be understood that embodiments described herein are directed to methods and apparatuses for of high temperature bonding of substrates to develop a strengthened bonding or bond layer having a variable porosity distribution between two bonded substrates or a plurality of substrates. Described herein are methods and apparatuses to form such TLPS systems and their joints, which are characterized by highly complex microstructures. The example methods described herein may be used to form a TLPS sinter joint microstructure that results in a strengthened bond layer and an increased compliance between two bonded substrates that may be used to bond semiconductor devices in power electronics applications, for example.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used throughout this disclosure, percentages of components in a material composition are described by their weight percent. For example, "%" as used herein refers to the weight percent of a component.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of bonding substrates, the method comprising:
   disposing a first composition comprising a low melting point material and one or more high melting point materials between a first substrate and a second substrate to form a substrate assembly, wherein:
   the one or more high melting point materials have a melting temperature that is higher than a melting temperature of the low melting point material, and
   the substrate assembly comprises a contacting surface of at least one of the first substrate and the second substrate and comprising at least a first area and a second area;
   applying a first force at the first area of the contacting surface of the substrate assembly; and applying heat to the substrate assembly to form a bond layer of the first composition between the first and second substrates, wherein:
    a first formed porosity of the bond layer of the first composition is aligned with the first area of the contacting surface,
    a second formed porosity of the bond layer of the first composition is aligned with the second area of the contacting surface to which the first force was not applied, and
    the first formed porosity is different from the second formed porosity.

2. The method of claim 1, wherein no force is applied to the second area of the contacting surface.

3. The method of claim 1, wherein the first area of the contacting surface is aligned with a central area of the substrate assembly.

4. The method of claim 1, wherein the second area of the contacting surface is aligned with an outer edge area of the substrate assembly.

5. The method of claim 1, wherein the first substrate comprises Si or SiC.

6. The method of claim 1, wherein the second substrate is direct bonded copper or direct bonded aluminum.

7. The method of claim 1, wherein bonding comprises a high temperature bonding that is one of a transient liquid phase sintering heating and a diffusion soldering.

8. The method of claim 1, wherein the low melting point material comprises a weight percent of 70% tin and the one or more high melting point materials comprises a weight percent of 30% Ni.

9. The method of claim 1, further comprising:
    applying a second force at the second area of the contacting surface of the substrate assembly.

10. The method of claim 9, wherein the second force is less than the first force and is greater than zero.

11. The method of claim 9, wherein the first area of the contacting surface is aligned with a central area of the substrate assembly, and the second area of the contacting surface is aligned with an outer edge area of the substrate assembly.

12. The method of claim 9, wherein the second force comprises at least two separate first and second reduced forces that are each less than the first force.

13. The method of claim 12, wherein:
    the first reduced force comprises a force greater than zero and is applied to a first portion of the second area aligned with the first reduced force, and
    the second reduced force comprises a zero force such that no force is applied to a second portion of the second area aligned with the second reduced force.

14. The method of claim 13, wherein:
the first area of the contacting surface is aligned with a central area of the substrate assembly,
the first portion of the second area of the contacting surface is aligned with an inner portion of an outer edge area of the substrate assembly, and
the second portion of the second area of the contacting surface is aligned with an outer portion of the outer edge area of the substrate assembly.

15. The method of claim 1, wherein the one or more high melting point materials comprises a material that is selected from at least one of a group consisting of Ni, Cu, Ag, and Al.

16. The method of claim 15, wherein the low melting point material comprises a weight percent of 70% tin and the one or more high melting point materials comprises a weight percent of 30% of the material that is at least one of a group selected from Ni, Cu, Ag, and Al.

17. The method of claim 1, wherein:
applying a first force at the first area of the contacting surface of the substrate assembly comprises applying the first force via a first force application device; and
the first force application device comprises at least one of one or more weights, a hydraulic pressure device, and a gas pressure device.

18. The method of claim 17, wherein the one or more weights comprise a range of from about 500 g to about 1 kg.

19. A system for bonding of substrates, the system comprising:
    a force application device;
    a substrate assembly in contact with the force application device, the substrate assembly comprising:
        a first substrate,
        a second substrate, and
        a first composition comprising a low melting point material and one or more high melting point materials, wherein:
            the low melting point material and the one or more high melting point materials are disposed between the first and second substrates;
            the one or more high melting point materials have a melting temperature that is higher than a melting temperature of the low melting point material; and
            the force application device applies a first force at a first area of a contacting surface of at least one of the first substrate and the second substrate; and
    a heat application device that applies heat to the substrate assembly to form a bond layer of the first composition between the first and second substrates, wherein:
        a first formed porosity of the bond layer of the first composition is aligned with the first area, and the first area is aligned with a central area of the first composition of the substrate assembly,
        a second formed porosity of the bond layer of the first composition is aligned with a second area of the contacting surface to which the first force was not applied, the second area is aligned with a periphery of an outer edge area of the first composition of the substrate assembly, and the periphery of the outer edge area is disposed around the central area of the first composition of the substrate assembly, and
        the first formed porosity is different from the second formed porosity.

\* \* \* \* \*